United States Patent

Watanabe et al.

[11] Patent Number: 5,926,375
[45] Date of Patent: Jul. 20, 1999

[54] SURFACE MOUNTING STRUCTURE

[75] Inventors: Hideki Watanabe; Tsutomu Imai; Takeshi Yamaguchi; Tositada Netsu, all of Hadano; Kenichi Kasai, Ushiku; Fumio Imahashi, Hadano; Satoru Ezaki, Hadano; Mitugu Shirai, Hadano, all of Japan

[73] Assignee: Hitachi, Ltd., Tokyo, Japan

[21] Appl. No.: 08/626,940

[22] Filed: Apr. 3, 1996

[30] Foreign Application Priority Data

Apr. 7, 1995 [JP] Japan .................................. 7-082288

[51] Int. Cl.⁶ ........................................................ H05K 7/10
[52] U.S. Cl. .......................... 361/760; 361/772; 361/773; 361/774; 439/55; 439/68; 439/876; 439/179; 257/92; 257/690; 257/697; 257/774; 174/266; 174/250; 174/262
[58] Field of Search .................................. 361/760, 772, 361/773, 774, 777, 779, 780; 174/250, 251, 255, 260, 262, 263, 264; 439/68, 83, 179; 257/690, 697, 774, 778, 779, 780, 782, 784, 723

[56] References Cited

U.S. PATENT DOCUMENTS

| | | | |
|---|---|---|---|
| 4,750,092 | 6/1988 | Werther | 361/400 |
| 4,787,853 | 11/1988 | Igarashi | 439/55 |
| 4,834,662 | 5/1989 | Schempp et al. | 439/83 |
| 5,164,818 | 11/1992 | Blum et al. | 257/778 |
| 5,264,729 | 11/1993 | Rostoker et al. | 257/774 |
| 5,669,783 | 9/1997 | Inoue et al. | 439/331 |

FOREIGN PATENT DOCUMENTS 59-121993  7/1984  Japan .

*Primary Examiner*—Leo P. Picard
*Assistant Examiner*—David Foster
*Attorney, Agent, or Firm*—Fay, Sharpe, Beall, Fagan, Minnich & McKee

[57] ABSTRACT

A circuit board is provided with blind connection vias which are filled with solder. The end portions of the pins of an electronic component are inserted into the connection vias, and are connected to the connection vias by solder. The electronic component is surface mounted on the circuit board with the major portions of the pins exposed.

9 Claims, 2 Drawing Sheets

SURFACE MOUNTING STRUCTURE

FIELD OF THE INVENTION AND RELATED ART STATEMENT

The present invention relates to a surface mounting structure in which electronic components having multiple leads or pins (such as multi-chip modules, semiconductor devices, connectors and passive elements) are mounted on a multi-layered printed circuit board.

The demand for higher performance electronic devices at a less expensive cost is growing today. The combination of a high degree of integration (high performance) and low-cost (inexpensive) is required of surface mount technology.

Typically available today to achieve a high degree of integration is the mounting method in which an LSI (Large Scale Integrated Circuit) packaged into a plastic QFP (Quad Flat Package) is surface-mounted on a circuit board. Along with the high-performance design of the LSI, the number of leads or pins of the LSI increases. If a QFP is used, the resulting packaging density cannot be increased because it has an oversized package. Along with a high degree of integration, the pin pitch gets finer, and the manufacturing cost is accordingly increased. To solve these problems, it has been proposed to arrange the pins two-dimensionally. BGA (Ball Grid Array) and PGA (Pin Grid Array) are typical examples of such two-dimensional pin configuration packages.

BGA is a new package, which has been recently employed. Although the BGA package is expected to continuously advance in acceptance in the future, it is not yet commonly used. The PGA package is typically mounted on a printed circuit board by allowing the pins of the package to be inserted into through-holes provided on the printed circuit board for solder connection. Thus, at the locations of the through-holes, no inner-layer vias are formed in a multilayered board. Since the number of wiring traces running to bypass the through-holes is reduced, the wiring density on the printed circuit board is not increased. The PGA package is not very well suited to a high packaging density design.

Regardless of such a disadvantage, a surface mounting technique using the PGA package has been proposed to increase the on-board wiring density of the printed circuit board.

JP-A-59-121993 discloses a surface mounting structure in which each of the short pins of a PGA package is almost entirely embedded in a recess provided in the printed circuit board. Furthermore, an article entitled "Optimum mounting of MCM and MCM package to PWB" in the July 1994 Issue of "Hyoumen Jissou Gijutsu" (Surface Mount Technology), pages 9–15, describes another surface mounting structure in which the interconnect pins of the PGA package are pressed into contact with the lands of a printed circuit board, and then the interconnect pins and the lands are connected with each other by soldering.

In the above-cited first structure, the PGA package is substantially connected to the printed circuit board in a face to face manner. When a large difference in thermal expansion occurs between the PGA package and the board in the course of powering up and down the package during use, an excess strain or stress is likely to take place at the solder joints of pins and the junctions of the pins to the PGA package. The reliability of the electrical connection is thus difficult to assure.

In the above-cited second structure, solder fillets are likely to suffer enlarged strain arising from the moment that takes place when the pins are deflected, and there is thus a limitation of the package size of the PGA, within which the connection reliability is assured.

OBJECT AND SUMMARY OF THE INVENTION

It is an object of the present invention to provide a surface mounting structure that offers high connection reliability and high packaging density, as well.

To this end, according to the present invention, there is provided a surface mounting structure comprising: an electronic component with multiple leads; a multi-layered circuit board with wiring, on which the electronic component is mounted; multiple bottomed vias formed on the circuit board, each electrically connected to the respective wire in the circuit board and accommodating the respective lead of the electronic component; and a joint material for connecting each leads to the respective via.

DETAILED DESCRIPTION OF PREFERRED EMBODIMENTS

Figure 1:
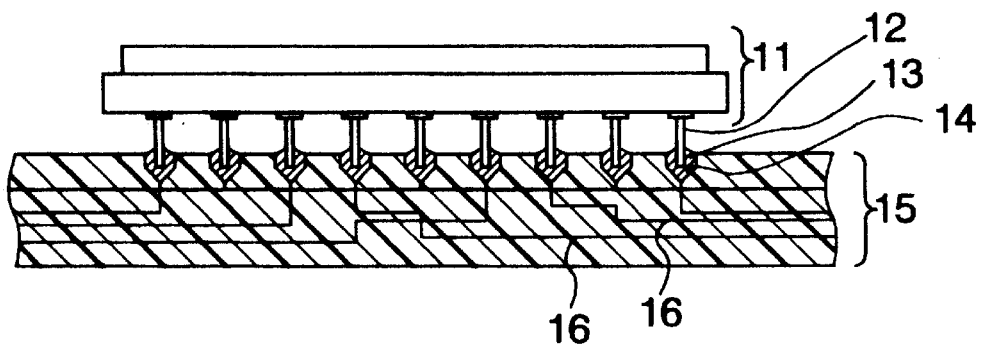
FIG. 1 is a fragmentary cross-sectional view showing the surface mounting structure of an electronic component according to an embodiment of the present invention.

In FIG. 1, a number of nail-head pins 12 made of Kovar (29Ni—17Co—Fe alloy) are brazed, in grid configuration, on a surface of an alumina PGA package 11. The nail-head pins are coated with an Ni—Au plating (not shown), and their ends are beveled in barreling that is performed in a molding process.

A printed circuit board 15 whose base material is polyimide resin has, on its area where the PGA package 11 is to be installed, connection bottomed vias or recesses 14 which are face to the nail-head pins 12. The printed circuit board 15 is a multi-layered printed circuit board having wiring 16 at inner layers as shown in FIG. 1.

The diameter of the connection via 14 is 0.5 mm, and is larger than the diameter of the nail-head pin 12 which is 0.2 mm. The connection via 14 is set to be as deep as approximately 0.5 mm so that the ratio of the diameter to the depth of the connection via 14 may be approximately 1. The connection vias 14 thus designed receive a sufficient amount of solder paste when they are filled with solder paste in screen printing. The thickness of the printed circuit board 15 is 4 mm.

The connection via 14 is provided on a bottom thereof with an inverted conical recess which leads the pin 12 to a center of the connection via 14. The inner wall of the connection via 14 is coated with a Cu plating (not shown) to ensure good solderability. The connection vias 14 are electrically connected to the wiring 16 disposed at the inner layers of the printed circuit board 15.

The connection vias 14 are filled with eutectic lead-tin solder 13 (melting point 183° C.) by means of the screen printing.

The end portions of the nail-head pins 12 are mated with the connection vias 14. In this case, a proper external force may be applied as necessary so that the ends of the pins are guided to the centers of the connection vias. The printed circuit board 15 along with the package 11 is introduced into a reflow device and then they are heated.

When the solder 13 melts, the nail-head pins 12 of the PGA package 11 sink into the connection vias 14 by their own weight. The ends of the pins are seated to the centers of the vias 14 by the guidance of the shape of the bottom of each via 14. The end portions of the nail-head pins 12 are thus connected to the corresponding connection vias 14 through the solder 13.

A length of part of the nail-head pin 12 accommodated in the connection via 14 is approximately 0.4 mm. A whole length of the nail-head pin 12 is approximately 3 mm. Thus, the PGA package 11 is mounted on the board 15 with the major portion of each nail-head pin 12 remaining exposed to the outside.

Therefore, even if there is a thermal expansion difference between the package 11 and the board 15, the major portion or exposed portion of each nail-head pin 12 deflects to absorb the thermal expansion difference, thereby relieving the junction of the package to the board of excess strain or stress. The reliability of the electrical connection is thus ensured.

Figure 5:
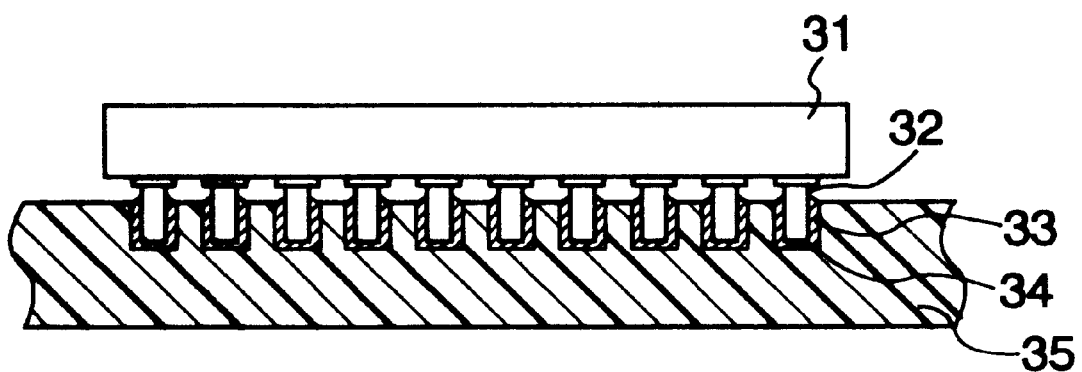
FIG. 5 is a fragmentary cross-sectional view showing one prior art surface mounting structure.

On the contrary, in the structure disclosed in JP-A-59-121993, a PGA package 31 has short connection pins 32 as shown in FIG. 5, and the major portion of the pin 32 is embedded into a connection via 34 of a board 35. Therefore, the PGA package 31 is connected to a printed circuit board 35 substantially in a face to face manner. When a large difference in thermal expansion occurs between the PGA package and the board in the course of powering up and down the package during use, an excess strain or stress is likely to take place at the solder joints 33 of pins 32 and the junctions of the pins 32 to the PGA package 31. The reliability of the electrical connection is thus difficult to maintain.

Figure 6:
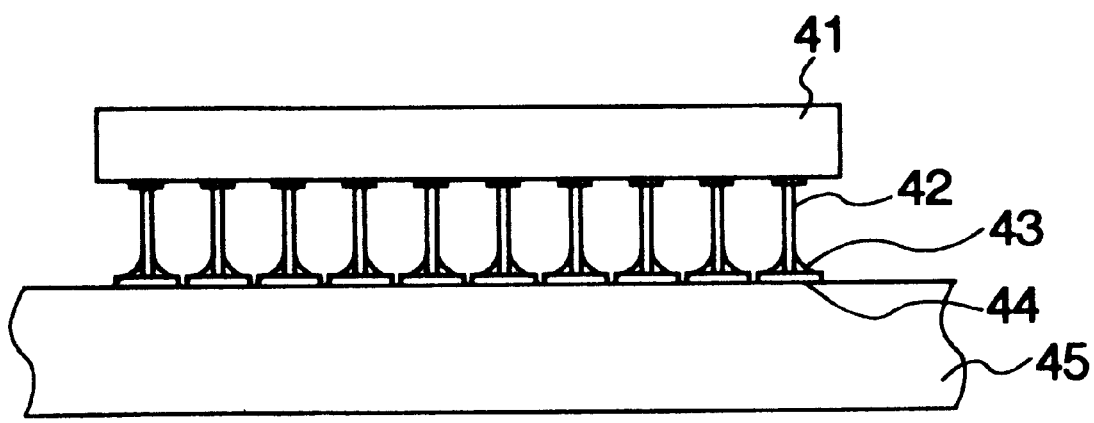
FIG. 6 is a fragmentary cross-sectional view showing another prior art surface mounting structure.

In the structure described in "Hyoumen Jissou Gijutsu" (Surface Mount Technology), a thermal expansion difference between a PGA package 41 and a printed circuit board 45 is adapted to be absorbed by the interconnect pins 42 only as shown in FIG. 6. Solder fillets 43 are likely to suffer enlarged strain arising from a moment that takes place when the interconnect pins 42 are deflected. There is thus a limitation of the package size of the PGA, within which the connection reliability is assured. To reduce the deviation in the form of the solder fillets 43 and to reduce strain, a stringent requirement needs to be imposed on the uniformity of the heights or lengths of the interconnect pins 42 and the flatness of the printed circuit board 45. This drives up the component cost.

This embodiment of the present invention is free from these problems.

From the stress calculation and evaluation tests of connection life, the inventors have derived a method of determining the length of the exposed portion of the pin that ensures a given connection service life, which depends on the cross-sectional dimension of the pin and the thermal expansion difference between an electronic component and a printed circuit board. According to this method, the length of the end portion of the pin that is embedded into the connection via ranges preferably from one-tenth to half the entire length of the pin.

The deeper the connection via becomes, the better the reliability of the connection becomes. However, the depth of the connection via should be determined in consideration of the preference that the wiring and the through-holes be provided in the inner layers of the board. As a result, the depth of the vias is less than half the thickness of the board, and preferably less than one-quarter the thickness of the board.

The pin is square or round at its cross-section, and the typical dimension thereof is 0.1 mm to 0.5 mm. The diameter of the connection vias with which the pins are mated ranges from 0.2 mm to 0.6 mm in consideration of the dimensional accuracy and positioning accuracy. When the solder paste printing method that is a simple solder feeding method is used, the ratio of the depth to the diameter of the via is approximately 1. In this embodiment, the diameter of the connection via 14 is 0.5 mm, and the depth of the connection via 14 including the inverted conical recess portion is 0.6 mm.

The thickness of the printed circuit board generally ranges from 2 mm to 10 mm, and is determined according to the wiring capacity thereof. According to the present invention, the wiring density is increased, and then the thickness of the board may be halved from 1 mm to 5 mm, given the same level of wiring capacity. Such a design offers a substantial cost reduction.

Another embodiment of the present invention is now discussed hereinafter.

Figures 2, 3:
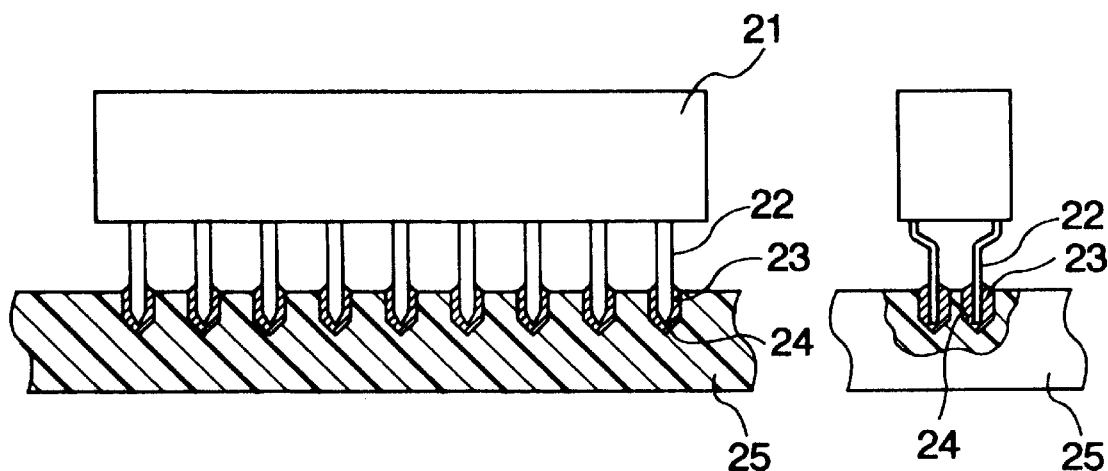
FIG. 2 is a fragmentary cross-sectional view showing the surface mounting structure of an electronic component according to another embodiment of the present invention.
FIG. 3 is a side view showing the structure of FIG. 2.

In FIG. 2, a body of a multi-pin connector 21 made of a PPS resin is provided on a one surface thereof with flat leads 22 made of phosphor bronze in a grid configuration. The leads 22 are solder coated to ensure a good connection. An end of the lead 22 is tapered.

A printed circuit board 25 made of glass-epoxy resin has, on its area where a multi-pin connector 21 is to be installed, blind connection vias 24 which correspond to the respective leads 22 of the connector 21.

In this embodiment, the connection via 24 has a diameter larger than a typical dimension of the lead 22. Furthermore, the ratio of the diameter of the connection via to the depth of thereof 24 is approximately 1. The connection via 24 has an inverted conical bottom. An inner wall of the connection via 24 is coated with a Cu plating (not shown) to ensure a good connection. The connection vias 24 are electrically connected to the wiring disposed at the inner layers (not shown) of the printed circuit board 25.

The connection vias 24 are filled with eutectic tin-silver solder 23 (melting point 221° C.) by means of the screen printing.

The multi-pin connector 21 is placed on the board 25 so that the ends of the leads 22 come into contact with the connection vias 24 filled with the solder 23. The printed circuit board 25 with the connector 21 which is urged against the board 25 is introduced into a reflow device. As the solder 23 melts, the leads 22 sink into the bottom centers of the connection vias 24, and then the soldering connection between the lead 22 and the connection via 24 is completed.

In this embodiment, the length of a part of the lead 22 embedded in the connection via 24 is one-third to half of the entire length of the lead 22, and the connector 21 is thus mounted to the board 25 with the major part of the lead 22 remaining exposed.

As shown in FIG. 3, the leads 22 are bent inwardly. Thus, the exposed portion of each lead has a higher flexibility. This embodiment is thus applicable to an elongated connector.

The inventors have found that when an electronic component is surface mounted on a printed circuit board, due to a difference in the thermal expansion coefficient between the electronic component and the printed circuit board, the fatigue failure of joint material in the connection portion takes place selectively either at the inner side (the center of the component) of the lead or at the outer side (the periphery of the component) of the lead.

For example, in case of an alumina PGA package mounted on a printed circuit board by means of solder, a heat cycle test showed that, at each joint portion, fatigue failure has developed and had advanced in from the inner side of each lead. However, the fatigue failure had hardly been developed at the outer side of the lead.

This suggests that the electrical connection between a lead and a printed circuit board would be maintained for a longer time period if the fatigue-resistant side of the joint portion is further reinforced to prevent the fatigue failure.

In this embodiment, when the PGA package 11 described in the preceding embodiments is surface mounted on the printed circuit board 15, each connection via 14 is provided to be slightly deviated radially outwardly from the center of the nail-head pin 12. This arrangement allows more clearance between the wall of the connection via 14 and the nail-head pin 12, at its outer side than at its inner side. The quantity of solder at the outer side of each pin is accordingly increased, ensuring a firm joint between the nail-head pin 12 and the connection via 14. The spread of fatigue failure is thus prevented and the electrical connection between the PGA package 11 and the printed circuit board 15 is maintained for a long period of time.

Figure 4:
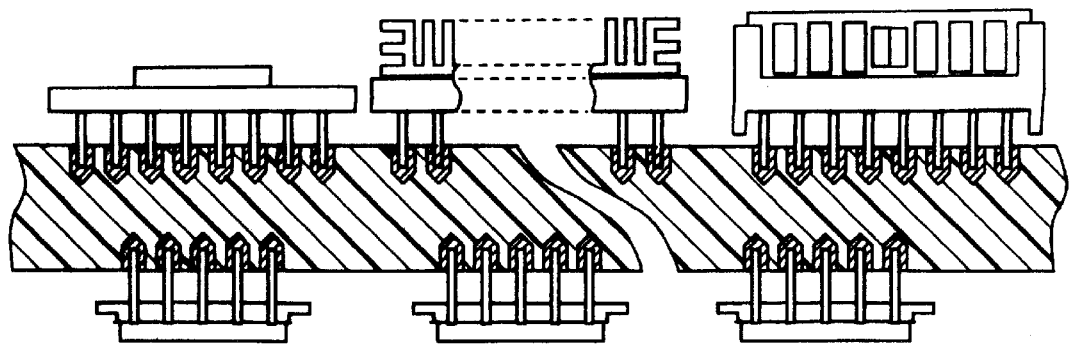
FIG. 4 is a fragmentary cross-sectional view showing the surface mounting structure of electronic components according to yet another embodiment of the present invention.

FIG. 4 shows an example of the surface mounting structure in which electronic components are mounted on both sides of a multi-layered printed circuit board. This structure offers an increased packaging density and reduces overall wiring length between electronic components.

The structure of this invention is adapted to surface mounting for a multi-chip module or other components the number of whose leads or pins is from several hundreds to several thousands.

According to the present invention, an electronic component is so mounted on a printed circuit board that only the end portion of each lead is engaged with the respective via and the major portion of the lead is exposed. Therefore, even though there is a thermal expansion difference between the electronic component and the printed circuit board, the major portion of the lead is deformed to absorb such difference.

Since the joint material at each joint portion is retained in each connection via, the joint material is insusceptible to the effect of moment due to the deflection of the lead. This minimizes the strain in the joint material.

Furthermore, since each pin is engaged at an end portion thereof with the respective via, variations in the lengths of the leads and in the flatness of the printed circuit board are covered by the engaging portion.

What is claimed is:

1. A surface mounting structure, comprising:
    an electronic component with multiple leads;
    a multi-layered circuit board with wiring, on which said electronic component is mounted;
    multiple bottomed vias formed on said circuit board, each electrically connected to the respective wire in said circuit board and accommodating the respective lead of said electronic component; and
    a joint material for connecting each said lead to the respective via;
    wherein a length of a part of said lead accommodated in said via is from one-tenth to half of an entire length of said lead.

2. A surface mounting structure according to claim 1, wherein said circuit board is a printed circuit board, and said electronic component is of a ceramic chip-package having leads whose number is from several hundreds to several thousands.

3. A surface mounting structure, comprising:
    an electronic component with multiple leads;
    a multi-layered circuit board with wiring, on which said electronic component is mounted;
    multiple bottomed vias formed on said circuit board, each electrically connected to the respective wire in said circuit board and accommodating the respective lead of said electronic component; and
    a joint material for connecting each said lead to the respective via;
    wherein a length of a part of said lead accommodated in said via is from one-tenth to half of an entire length of said lead;
    wherein a dimensional ratio of a diametrical dimension of said via to a depthwise dimension of said via is 1.

4. A surface mounting structure, comprising:
    an electronic component with multiple leads;
    a multi-layered circuit board with wiring, on which said electronic component is mounted;
    multiple bottomed vias formed on said circuit board, each electrically connected to the respective wire in said circuit board and accommodating the respective lead of said electronic component; and
    a joint material for connecting each said lead to the respective via;
    wherein a length of a part of said lead accommodated in said via is from one-tenth to half of an entire length of said lead;
    wherein the depthwise dimension of the via is equal to or less than a half of a thickness of said circuit board.

5. A surface mounting structure according to claim 4, further comprising said electronic component being a first electronic component and further including a second electronic component with multiple leads mounted on said circuit board, and wherein the depths of all vias are equal.

6. A surface mounting structure according to claim 5, wherein said circuit board is a printed circuit board, and said first electronic component is of a ceramic chip-package having leads whose number is from several hundreds to several thousands.

7. A surface mounting structure, comprising:
    an electronic component with multiple leads;
    a multi-layered circuit board with wiring, on which said electronic component is mounted;
    multiple bottomed vias formed on said circuit board, each electrically connected to the respective wire in said circuit board and accommodating the respective lead of said electronic component;
    a joint material for connecting each said lead to the respective via;
    wherein a length of a part of said lead accommodated in said via is from one-tenth to half of an entire length of said lead; and further comprising another electronic component with multiple leads, and wherein these electronic components are mounted on both sides of said circuit board.

8. A surface mounting structure according to claim 7, wherein said circuit board is a printed circuit board, and said electronic component is of a ceramic chip-package having leads whose number is from several hundreds to several thousands.

9. A surface mounting structure, comprising:

an electronic component with multiple leads;

a multi-layered circuit board with wiring, on which said electronic component is mounted;

multiple bottomed vias formed on said circuit board, each electrically connected to the respective wire in said circuit board and accommodating the respective lead of said electronic component;

a joint material for connecting each said lead to the respective via;

wherein a length of a part of said lead accommodated in said via is from one-tenth to half of an entire length of said lead; and wherein said circuit board is a printed circuit board, and said electronic component is of a ceramic chip-package having leads whose number is from several hundreds to several thousands.

* * * * *